Oct. 24, 1967 E. PAMMER 3,348,984
METHOD OF GROWING DOPED CRYSTALLINE LAYERS OF SEMICONDUCTOR MATERIAL UPON CRYSTALLINE SEMICONDUCTOR BODIES
Filed Dec. 23, 1964
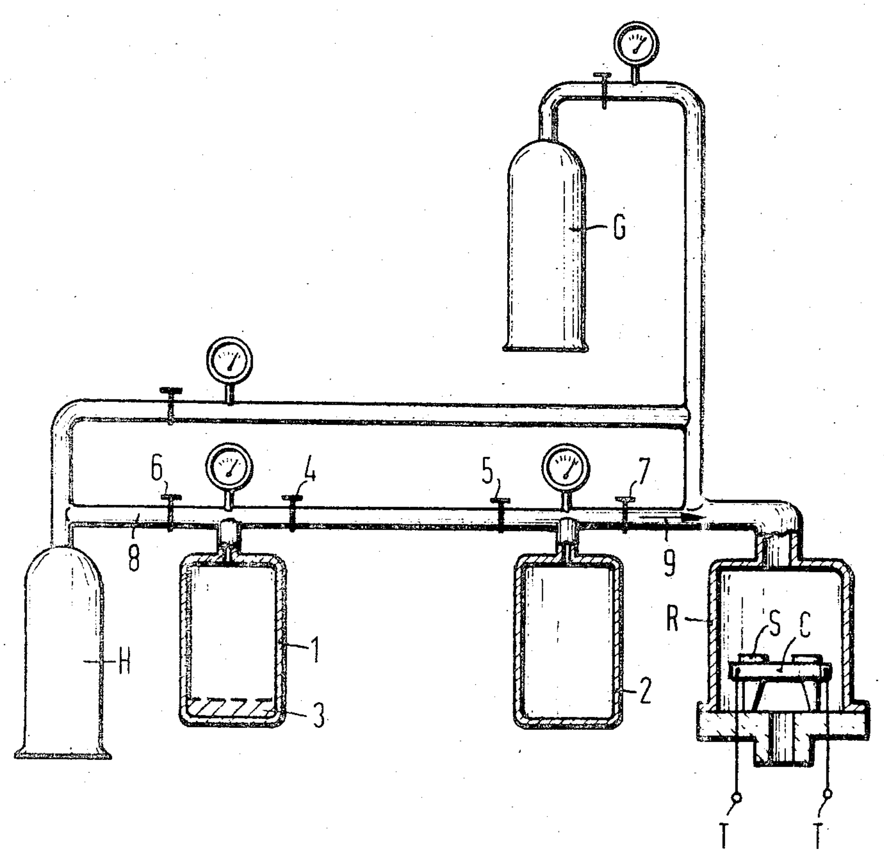

United States Patent Office 3,348,984

Patented Oct. 24, 1967

3,348,984

METHOD OF GROWING DOPED CRYSTALLINE LAYERS OF SEMICONDUCTOR MATERIAL UPON CRYSTALLINE SEMICONDUCTOR BODIES

Erich Pammer, Munich, Germany, assignor to Siemens & Halske Aktiengesellschaft, Berlin, and Munich, Germany, a corporation of Germany.

Filed Dec. 23, 1964, Ser. No. 420,638
Claims priority, application Germany, Jan. 3, 1964, S 88,949
11 Claims. (Cl. 148—174)

My invention relates to a method of growing crystalline, preferably monocrystalline semiconductor layers of homogeneous dopant concentration upon crystalline semiconductor bodies by supplying a gaseous doping substance, such as a gaseous compound of the dopant, mixed with a carrier gas and together with a gaseous compound of the semiconductor material, into a reaction chamber where the compounds are thermally dissociated and the semiconductor material and the doping substance are precipitated upon the semiconductor bodies.

The layers grown in this manner may all have the same specific resistance and the same type of conductivity so that the resulting semiconductor monocrystals have throughout a homogeneous dopant distribution, or successively grown layers may have different specific resistance and/or respectively different types of conductivity.

With the first-mentioned mode of performing the method, the carrier bodies, in most cases, are elongated wire- or filament-shaped structures whose thickness is uniformly increased by the precipitation. This method is known for example from U.S. Patent 3,011,877. The second mode of performing the method is predominantly applied with disc- or wafer-shaped substrates of semiconductor material and is known, for example, from U.S. Patent 3,145,447.

The desired specific resistance of the grown layers is obtained by adding a given quantity of doping substance or a chemical compound of the dopant, mixed with a carrier gas, for example hydrogen, to the gaseous compound of the semiconductor material being precipitated. During precipitation the ratio of semiconductor material to doping substance in the gaseous mixture must be kept constant for securing homogeneity of the layers being grown.

The dopant concentration in semiconductor material is in the order of magnitude of $10^{16}$ to $10^{19}$ atoms/cm.$^3$ of semiconductor material. Adjusting and maintaining such a slight concentration involves considerable difficulties and requires a large amount of supervisory or control equipment. As a rule, the carrier gas, such as a current of hydrogen, is passed over the doping substance which is employed either in liquid or solid form and maintained at a constant temperature. In this manner, the dopant entrained in the carrier gas is given the desired degree of dilution. The required, very low vapor pressure of the doping substance is adjusted by cooling the liquid or solid doping substance to a correspondingly low temperature. This low temperature must be kept constant, at least approximately, and the flow rate of the carrier gas must be accurately controlled or regulated. Despite such efforts and the large amount of equipment involved, resistance fluctuations in the resulting grown layers are often encountered. Such fluctuations may be due to slight fluctuations in temperature or, among other things, they may be due to the fact that the saturation vapor pressure of the doping substance at these low temperatures does not maintain the necessary uniformity.

It is an object of my invention to minimize or obviate such difficulties and deficiencies.

More particularly, it is an object of my invention to prevent temperature variations in the performance of semiconductor precipitation methods of the above-mentioned type from resulting in faults or nonuniformities with respect to the dopant distribution in the grown semiconductor layers.

Another object of the invention, relating to methods of the above-mentioned kind, is to afford precipitating uniformly doped semiconductor layers without the necessity for low-temperature cooling of the dopant substance to be entrained by the flow of carrier gas, and preferably permit operating at normal room temperature.

According to the invention, the method of growing doped crystalline or monocrystalline semiconductor layers upon crystalline semiconductor bodies by thermal dissociation of gaseous semiconductor compound in mixture with gaseous dopant substance and carrier gas, is performed by placing the dopant material in volatilizable constitution, that is solid or liquid form, into a first pressure-resistant vessel, filling this vessel with carrier gas up to a given high pressure, for example 100 to 200 atmospheres, and adjusting the saturation vapor pressure of the dopant in the first vessel for a given temperature. After the saturation pressure is reached, the gas mixture from the first pressure vessel, or at least a portion of the mixture, is transferred into a second pressure-resistant vessel which is free of non-gaseous dopant and preferably at a lower pressure than the first vessel. The gaseous doping substance or gaseous compound thereof, in mixture with the carrier gas, is then taken from the second pressure vessel through a pressure reduction valve and supplied to the reaction space together with the gaseous compound of the semiconductor material. The above-described thermal dissociation of the ultimate mixture and the precipitation of the evolving doped semiconductor material upon the carrier or substrate is then effected in the manner already described.

With the method according to the invention, the occurrence of temperature variations in the dopant-containing pressure vessels has no effect upon the quality or distribution of the doping substance in the precipitated semiconductor layer. The method also affords the advantage that the operations outside the reaction vessel proper may be performed at normal room temperature. Even when growing very weakly doped semiconductor layers, it is not necessary to apply a low temperature, for example below 0° C., which in the known method is necessary to provide for slight vapor pressure of the doping substance. Nevertheless, the operation in the method of the invention can be performed with large quantities of gas even if slight dopant concentrations are to be obtained, so that the difficulties encountered with adjusting and measuring very small gas currents are likewise obviated. As will further be shown, the desired dilution of the doping substance with carrier gas is adjusted in a simple manner.

The invention is predicated upon the following recognition.

If a volatile, for example solid or liquid, substance is placed into a pressure-resistant vessel, the substance evaporates until the saturation vapor pressure of the substance for the particular temperature obtaining in the vessel is attained. When the vessel is then filled with gas, for example up to a pressure of 200 atmospheres, the ratio of gas to vapor in the resulting mixture is 200 times greater than at a gas pressure of 1 atmosphere.

According to Dalton's law, the saturation vapor pressure of a substance is independent of the partial pressure of any gases simultaneously present in the vessel. Hence, if a portion of the gaseous mixture is removed, another quantity of the volatile substance will evaporate as long as solid or liquid substance remains as a bottom body in the vessel, until the saturation vapor pressure for the adjusted temperature is again reached. As a consequence, a different gas-to-vapor ratio of the mixture in the vessel is now adjusted.

If one wants to obtain a constant mixing ratio when removing part of the gaseous mixture, it is therefore necessary to remove the bottom body; and this may be done by transferring the gaseous mixture, or a portion thereof, into a second pressure-resistant vessel containing no bottom body of volatile substance. For this purpose, the abovementioned second vessel is connected with the first pressure-resistant vessel through valves, and the pressure is permitted to equalize by opening the valves. When after equalization in pressure the valves are closed, the gaseous mixture in the second vessel has the same composition as in the first vessel, and this composition retains a constant mixing ratio when gas is taken from the second vessel. If the second vessel contains carrier gas at a given pressure lower than the pressure in the first vessel, before gas from the first vessel is passed into the second vessel, the vaporous substance is further diluted by the gas contained in the second vessel. A further dilution may also be obtained by a corresponding choice of the respective vessel volumes. For example, the second vessel may be given a larger volume than the first vessel to obtain a correspondingly greater dilution of the dopant gas.

In each case, the partial pressure of the evaporated substance in the second vessel may be readily calculated on the basis of the following equation.

$$P_{II}=P_{Sat}\left(\frac{V_1}{V_1+V_2}\right)\left(1-\frac{P_2}{P_1}\right) \quad (1)$$

wherein $P_{II}$ denotes the partial pressure in the evaporated substance in the second vessel, $P_{Sat}$ the saturation vapor pressure of the substance, $V_1$ the volume of the first pressure-resistant vessel, $V_2$ the volume of the second pressure-resistant vessel, $P_1$ and $P_2$ the pressures in the respective vessels prior to pressure equalization, $P_1$ being thus the sum of the partial pressures in the first vessel and $P_2$ the pressure of any gas contained in the second vessel. All pressure magnitudes in the right-hand term of the equation are to be related to the same temperature. The calculated partial pressure of the substance in the second pressure-resistant vessel then applies to this temperature.

The Equation 1 reveals that, for a given temperature, the partial pressure of the solid or liquid substance in the second pressure-resistant vessel decreases as $P_2$ and $P_1$ approach equality. Hence the partial pressure in the second vessel is the lower, the more the ratio $P_2/P_1$ approaches the unity value and the more the ratio $V_2/V_1$ increases. If $V_2$ is chosen equal to or larger than $V_1$, the partial pressure of the substance in the second vessel, even for $P_2=0$, is approximately equal to one-half of, or smaller than, the saturation vapor pressure of the substance at the particular temperature. In no event, therefore, will there occur a condensed substance in form of a bottom body in the second vessel. This is the reason why small variations in temperature do not affect the mixing ratio in the second vessel. Thus, the gas mixture in the second vessel is absolutely homogeneous, and its mixing ratio is independent of temperature and remains constant even if the pressure is reduced to that of the ambient atmosphere.

In accordance with the foregoing, the method of the invention may be performed in the following manner. A solid or liquid doping substance, either in elemental or metallic form or as a chemical compound, is placed into the first pressure-resistant vessel, and the vessel is filled with carrier gas up to several atmospheres of pressure, for example 100 to 200 atmospheres. Preferably used is hydrogen, although other gases such as nitrogen or argon are also applicable. After the saturation vapor pressure of the doping medium at the particular temperature has become adjusted in the first vessel, any desired dilution and consequently each desired dopant concentration in the semiconductor material to be subsequently precipitated can now be adjusted by transferring a given portion of the gas mixture from the first vessel into the second pressure-resistant vessel. The desired dilution of the doping medium by the carrier gas is adjusted by the choice of the respective vessel volumes and the pressures in the respective vessels, or also to a slight degree by the choice of the temperature at which the saturation vapor pressure of the doping medium is adjusted. The doping medium, for example the chemical compound of the doping substance in gaseous form, mixed with the carrier gas, is taken from the second pressure-resistant vessel through a pressure reduction valve, and is then supplied to the reaction chamber together with the gaseous compound of the semiconductor material to be precipitated, which latter compound likewise may be used in mixture with a carrier gas.

The invention will be further described with reference to an example of suitable equipment schematically illustrated on the accompanying drawing, and with reference to the production of monocrystalline, homogeneously doped layers of germanium epitaxially grown on monocrystalline substrates consisting of discs or wafers of germanium.

The drawing shows schematically at R the reaction vessel in which a heatable support C is mounted. The support, consisting for example of molybdenum or graphite, has a planar top surface on which a number of monocrystalline substrate wafers S of germanium are located. The ends of the support are electrically connected to external terminals T by means of which an electric current may be passed through the carrier C for heating it and the substrates to the required reaction temperature.

The semiconductor compound, being germanium tetrachloride in the processing example described below, is supplied from a steel tank or bottle G, and the carrier gas, in the following example hydrogen, is supplied from a steel tank or bottle H. The tanks are connected with the reaction vessel R through valve-controlled pipe lines more fully described hereinafter. The bottom of the reaction vessel R has an outlet for the residual gases.

Used as doping substance is gallium. An ampoule of glass containing about 10 g. of gallium trichloride $GaCl_3$ is placed into a dry, clean steel vessel 1. The vessel is then rinsed free of air. Subsequently the carrier gas is pressed into the vessel 1 through a connecting line 8 up to a pressure of 150 atmospheres. This pressure destroys the ampoule so that the gallium trichloride fills a bottom portion 3 of the vessel 1. Thereafter the valve 6 of line 8 is closed. The pressure vessel 1 is then left standing at substantially constant temperature until the saturation vapor pressure of the gallium trichloride is reached. This requires a waiting time of several hours, for example 10 to 12 hours, preferably overnight. A saturation vapor pressure of $8\cdot10^{-3}$ Torr thus adjusts itself at a temperature of 0° C. The non-evaporated $GaCl_3$ remains as a bottom body 3 in the pressure vessel 1. Now the pressure vessel 1 is placed in pressure-resistant communication with a second steel bottle or vessel 2 which in the illustrated example has the same volume as the vessel 1, and which already contains carrier gas, namely hydrogen, under a pressure of 100 atmospheres at normal room temperature (about 20° C.). The communication and the resulting equalization in pressure between the two vessels is obtained by opening the two valves 4 and 5 for a short interval of time. Relative to the pressure-resistant vessel 2, the partial pressure $P_{II}$ of gallium trichloride can be computed by Equation 1 as follows:

$$P_{II}=8\cdot10^{-3}\cdot0.5\left(1-\frac{100}{150}\right)$$
$$=1.32\cdot10^{-3}\text{ Torr}$$
$$=1.74\cdot10^{-6}\text{ atmospheres}$$

The total pressure in vessel 2 results as 125 atmospheres. The mixing ratio follows therefrom as:

$$\frac{GaCl_3}{H_2}=\frac{1.74\cdot 10^{-6}}{1.25\cdot 10^{2}}=1.4\cdot 10^{-8}$$

This mixture, symbolically indicated by an arrow 9, is drawn from the vessel 2 through a pressure reduction valve 7 and passes into the reaction vessel R together with the gaseous compound of the semiconductor material to be precipitated, for example germanium tetrachloride, from tank G. If desired, the semiconductor compound, too, may be mixed with carrier gas, such as hydrogen from tank H. The mixing ratio of the two gas mixtures can be adjusted simply by controlling the respective rates of gas flow.

The partial pressure $P_{IIexp}$ of the gallium trichloride in the gas mixture from vessel 2, when expanded to normal atmospheric pressure, results as:

$$P_{IIexp}=\frac{1.74\cdot 10^{-6}}{1.25\cdot 10^{2}}=1.4\cdot 10^{-8} \text{ atmospheres}$$

Adjusting this slight partial pressure of $GaCl_3$ in the known method would make it necessary to keep the temperature of the $GaCl_3$ at a constant temperatures of −50° C. and to pass a constant current of carrier gas over the $GaCl_3$. At this low temperature, however, the saturation vapor pressure adjusts itself extremely poorly. Furthermore, the necessity of maintaining such a low temperature constant requires a large amount of equipment. The method of the present invention eliminates these shortcomings and difficulties. It permits operating at normal room temperatures. Temperature variations have no effect upon the composition of the gas mixture in the pressure vessel 2. Also eliminated by the method of the invention, even if weakly doped semiconductor layers are to be grown, are the difficulties encountered with the known method when operating with extremely slight dopant concentrations under the gas-flow conditions required.

After pressure equalization between steel vessels 1 and 2, another quantity of carrier gas may be pressed through conduit 8 into the vessel 1, for example until the original pressure of 150 atmospheres is again reached. After the saturation vapor pressure of the $GaCl_3$ is attained, the pressure vessel 1 then is available for withdrawing another quantity of gas mixture. If desired, a portion of the gas mixture from vessel 1 may be transferred in an analogous manner to a third pressure-resistant vessel by pressure equalization. Depending upon the choice of the pressure and volumetric relation between vessels 1, 2 and the third vessel, this modification of the method affords supplying respective gaseous mixtures to two reaction vessels and to grow therein semiconductor layers having either exactly the same or respectively different dopant distributions.

The method according to the invention is analogously applicable to growing doped silicon layers on silicon, using silicon tetrachloride or silicochloroform and gallium trichloride, for instance. The invention is further of advantage in the production of other semiconductor materials, as well as in other methods requiring a gas to be provided with slight but constant admixtures of another gas.

To those skilled in the art it will be obvious upon a study of this disclosure that my invention is not limited to the particular substances nor to the particular equipment exemplified herein, but may be modified in various ways and be given embodiments other than particularly described herein, without departing from the essential features of my invention and within the scope of the claims annexed hereto.

I claim:

1. The method of growing doped crystalline semiconductor layers on crystalline semiconductor bodies in a reaction space by thermal dissociation from a gaseous mixture composed of semiconductor compound and dopant substance and carrier gas, which comprises the antecedent steps of placing the dopant substance in volatilizable constitution into a first pressure-resistant vessel, filling the vessel with the carrier gas up to a given pressure and keeping the carrier gas in said first vessel at a given temperature until the dopant vapor has attained saturation pressure, transferring at least part of the gaseous mixture from the first vessel into a second pressure resistant vessel free of non-gaseous dopant, and supplying the gas mixture through pressure-reducing means from said second vessel to the reaction space together with the gaseous compound of the semiconductor material to be precipitated in said space.

2. The method of growing doped crystalline semiconductor layers on crystalline semiconductor bodies in a reaction space by thermal dissociation from a gaseous mixture composed of semiconductor compound and dopant substance and carrier gas, which comprises the antecedent steps of placing the dopant substance in volatilizable constitution into a first pressure-resistant vessel, filling the vessel with the carrier gas up to a given pressure and permitting the dopant substance to partially evaporate at a given temperature up to saturation vapor pressure, the quantity of dopant substance placed into said volatilizable constitution being larger than the one evaporating in said first vessel so that a bottom body of said dopant substance remains in said first vessel when said saturation pressure is reached, transferring at least part of the gaseous mixture from the first vessel into a second pressure-resistant vessel free of any bottom body of said dopant substance and having a lower pressure than said first vessel, and supplying the gas mixture through pressure-reducing means from said second vessel to the reaction space together with the gaseous compound of the semiconductor material to be precipitated in said space.

3. In the method of growing doped semiconductor layers according to claim 2, said given pressure in said first vessel being about 100 to about 200 atmospheres.

4. In the method of growing doped semiconductor layers according to claim 2, said given temperature of said volatilizable dopant substance in said first vessel being approximately normal room temperature.

5. In the method of growing doped semiconductor layers according to claim 2, said dopant substance placed into said first vessel being a chemical compound of the dopant to be precipitated with said semiconductor material.

6. The method of growing doped crystalline semiconductor layers on crystalline semiconductor bodies in a reaction space by thermal dissociation from a gaseous mixture composed of semiconductor compound and dopant substance and carrier gas, which comprises the antecedent steps of placing into a first pressure vessel a bottom body of volatile compound of the dopant substance, filling the first vessel with carrier gas up to a given pressure and maintaining it at substantially constant temperature and permitting said dopant compound to evaporate from a remaining quantity of said bottom body until the saturation vapor pressure of said dopant compound is attained, transferring at least part of the gaseous mixture from the first vessel into a second pressure-resistant vessel free of any bottom body of dopant substance and having a lower pressure than said first vessel, supplying the gas mixture through pressure-reducing means from said second vessel to the reaction space, and simultaneously supplying another gaseous mixture of carrier gas and gaseous compound of the semiconductor material.

7. In the method of growing doped semiconductor layers according to claim 6, wherein the carrier gas filled into said first vessel and the carrier gas mixed with the semiconductor compound consist of the same gaseous substance.

8. In the method of growing doped semiconductor layers according to claim 1, said second vessel having substantially the same volume as said first vessel.

9. In the method of growing doped semiconductor layers according to claim 1, said second vessel having a larger volume than said first vessel.

10. The method of growing doped crystalline semiconductor layers on crystalline semiconductor bodies in a reaction space by thermal dissociation from a gaseous mixture composed of semiconductor compound and dopant substance and carrier gas, which comprises the antecedent steps of placing the dopant substance in volatilizable constitution into a first pressure-resistant vessel, filling the vessel with the carrier gas up to a given pressure and keeping the carrier gas in said first vessel at a given temperature until the dopant vapor has attained saturation pressure; separately filling a second pressure-resistant vessel with said carrier gas up to a pressure lower than said given pressure and higher than the pressure in said reaction space, said second vessel initially being substantially free of dopant; temporarily communicating the first vessel with the second vessel to equalize the pressure in both so as to transfer part of the gaseous mixture from the first vessel into the second vessel, discontinuing the communication between the vessels and supplying the gas mixture through pressure-reducing means from said second vessel to the reaction space together with the gaseous compound of the semiconductor material to be precipitated in said space.

11. The method of growing doped semiconductor layers according to claim 2, which comprises the further steps of refilling the first vessel with carrier gas under pressure and permitting further dopant substance to evaporate from said bottom body until attainment of saturation vapor pressure, then transferring at least part of the gaseous mixture from the first vessel into a third pressure-resistant vessel.

References Cited

UNITED STATES PATENTS

| | | | |
|---|---|---|---|
| 3,155,621 | 11/1964 | Cowlard et al. | 252—62.3 |
| 3,172,857 | 3/1965 | Sirtl | 252—62.3 |
| 3,173,802 | 3/1965 | Patel et al. | 148—174 |
| 3,173,812 | 3/1965 | Law | 148—175 |
| 3,318,814 | 5/1967 | Allegretti et al. | 252—62.3 |

DAVID L. RECK, *Primary Examiner.*

N. F. MARKVA, *Assistant Examiner.*